United States Patent
Sovero et al.

(10) Patent No.: US 9,800,227 B1
(45) Date of Patent: Oct. 24, 2017

(54) ACTIVE BANDPASS FILTER CIRCUIT WITH ADJUSTABLE RESISTANCE DEVICE AND ADJUSTABLE CAPACITANCE DEVICE

(71) Applicant: THE BOEING COMPANY, Chicago, IL (US)

(72) Inventors: Emilio A. Sovero, Thousand Oaks, CA (US); Jongchan Kang, Moorpark, CA (US); Mohiuddin Ahmed, Moorpark, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/236,091

(22) Filed: Aug. 12, 2016

(51) Int. Cl.
 *H03K 5/00* (2006.01)
 *H03H 11/12* (2006.01)

(52) U.S. Cl.
 CPC ... *H03H 11/1217* (2013.01); *H03H 2210/012* (2013.01); *H03H 2210/025* (2013.01); *H03H 2210/028* (2013.01)

(58) Field of Classification Search
 CPC .............. H03H 11/0422; H03H 11/04; H03H 11/1291; H03H 11/1213; H03K 5/1252
 USPC .................................................. 327/551–559
 See application file for complete search history.

(56) References Cited

U.S. PATENT DOCUMENTS

| | | | | |
|---|---|---|---|---|
| 5,045,956 A | * | 9/1991 | Ejima | G11B 15/1875 360/51 |
| 7,324,615 B2 | * | 1/2008 | Lourens | G04G 5/002 375/343 |
| 8,482,339 B1 | * | 7/2013 | Giuroiu | H03H 11/54 327/513 |
| 2012/0293248 A1 | * | 11/2012 | Chen | H03H 11/1213 327/553 |

OTHER PUBLICATIONS

Xu et al.; A 0.8/2.4 GHz Tunable Active Band Pass Filter in InP/Si BiCMOS Technology; IEEE Microwave and Wireless Components Letters, vol. 24, No. 1.; Jan. 2014; (3 pages).

* cited by examiner

*Primary Examiner* — Dinh T Le
(74) *Attorney, Agent, or Firm* — Toler Law Group, PC

(57) ABSTRACT

In an illustrative example, a device includes an operational amplifier of an active bandpass filter circuit. The device further includes an adjustable resistance device configured to adjust a center frequency associated with the active bandpass filter circuit. The device further includes an adjustable capacitance device configured to adjust the center frequency and a bandwidth associated with the active bandpass filter circuit.

20 Claims, 8 Drawing Sheets

ACTIVE BANDPASS FILTER CIRCUIT WITH ADJUSTABLE RESISTANCE DEVICE AND ADJUSTABLE CAPACITANCE DEVICE

FIELD

The present disclosure generally relates to circuits for electronic devices.

BACKGROUND

An electronic device may include a filter that selects signals of particular frequencies. For example, a high-pass filter may receive an input signal having high frequencies and low frequencies and may generate an output signal having fewer low frequencies than the input signal. As another example, a low-pass filter may receive an input signal having high frequencies and low frequencies and may generate an output signal having fewer high frequencies than the input signal. Another example of a filter is a bandpass filter.

A bandpass filter may select signals of a particular frequency band. For example, a wireless communication protocol may specify that radio frequency (RF) messages are to be sent using a particular frequency band. A receiver may process the messages using a bandpass filter to reduce signal components (e.g., noise or interference) outside the particular frequency band.

In some devices, a frequency band associated with a bandpass filter may be adjustable. For example, an active bandpass filter may be adjustable to select the frequency band. In some designs, components used to adjust the frequency band may be large, expensive, or associated with high power consumption. Reducing a size or number of the components may reduce effectiveness of adjustment of the frequency band. Further, the components may be associated with instability in some circumstances, such as if a number of circuit loops causes unstable circuit behavior (e.g., oscillations) during operation of the active bandpass circuit.

SUMMARY

In an illustrative example, a device includes an operational amplifier of an active bandpass filter circuit. The device further includes an adjustable resistance device configured to adjust a center frequency associated with the active bandpass filter circuit. The device further includes an adjustable capacitance device configured to adjust the center frequency and a bandwidth associated with the active bandpass filter circuit.

In another illustrative example, a method includes adjusting a center frequency associated with an active bandpass filter circuit using an adjustable resistance device. The method further includes adjusting the center frequency and a bandwidth associated with the active bandpass filter circuit using an adjustable capacitance device.

In another illustrative example, a computer-readable storage medium includes instructions that, when executed by a processor, cause the processor to initiate operations. The operations include providing a set of control signals to an adjustable resistance device to adjust a center frequency associated with an active bandpass filter circuit. The operations further include providing a bias voltage to an adjustable capacitance device to adjust a bandwidth associated with the active bandpass filter circuit and to adjust the center frequency.

The described features, functions, and advantages may be achieved independently in various embodiments or may be combined in yet other embodiments further details of which can be seen with reference to the following description and drawings.

DETAILED DESCRIPTION

An active bandpass filter circuit includes an adjustable resistance device and an adjustable capacitance device. A center frequency of the adjustable resistance device may be determined (e.g., tuned) by adjusting a resistance of the adjustable resistance device and by adjusting a capacitance of the adjustable capacitance device. A bandwidth of the adjustable resistance device may be determined (e.g., tuned) by adjusting the capacitance of the adjustable capacitance device.

In an illustrative example, a coarse adjustment of the center frequency is performed using the adjustable resistance device and a fine adjustment of the center frequency is performed using a varactor of the adjustable capacitance device. The bandwidth may be adjusted using a switchable capacitor of the adjustable capacitance device, as an illustrative example.

Further, in some implementations, the bandwidth is adjustable independently of the center frequency, and fine adjustment of the center frequency does not substantially modify the bandwidth. For example, in some implementations, adjustment of the bandwidth does not affect the center frequency, and the bandwidth may be adjusted over a relatively wide range without substantially changing the center frequency. As a result, the active bandpass filter circuit may be relatively cost-effective and power-efficient (e.g., by using low complexity components, such as switches, resistors, capacitors, and varactors) while also enabling high precision of frequency band selection (e.g., by enabling adjustment of a center frequency substantially independently of a bandwidth, and vice versa).

In some implementations, the active bandpass filter circuit includes a stability capacitor configured to increase stability of the active bandpass filter circuit. In an illustrative example, the stability capacitor is coupled in parallel to the adjustable resistance device. The stability capacitor may be configured to increase stability of the active bandpass filter circuit by reducing or preventing oscillations of the active bandpass filter circuit during adjustment of the center frequency and the bandwidth.

Figure 1:
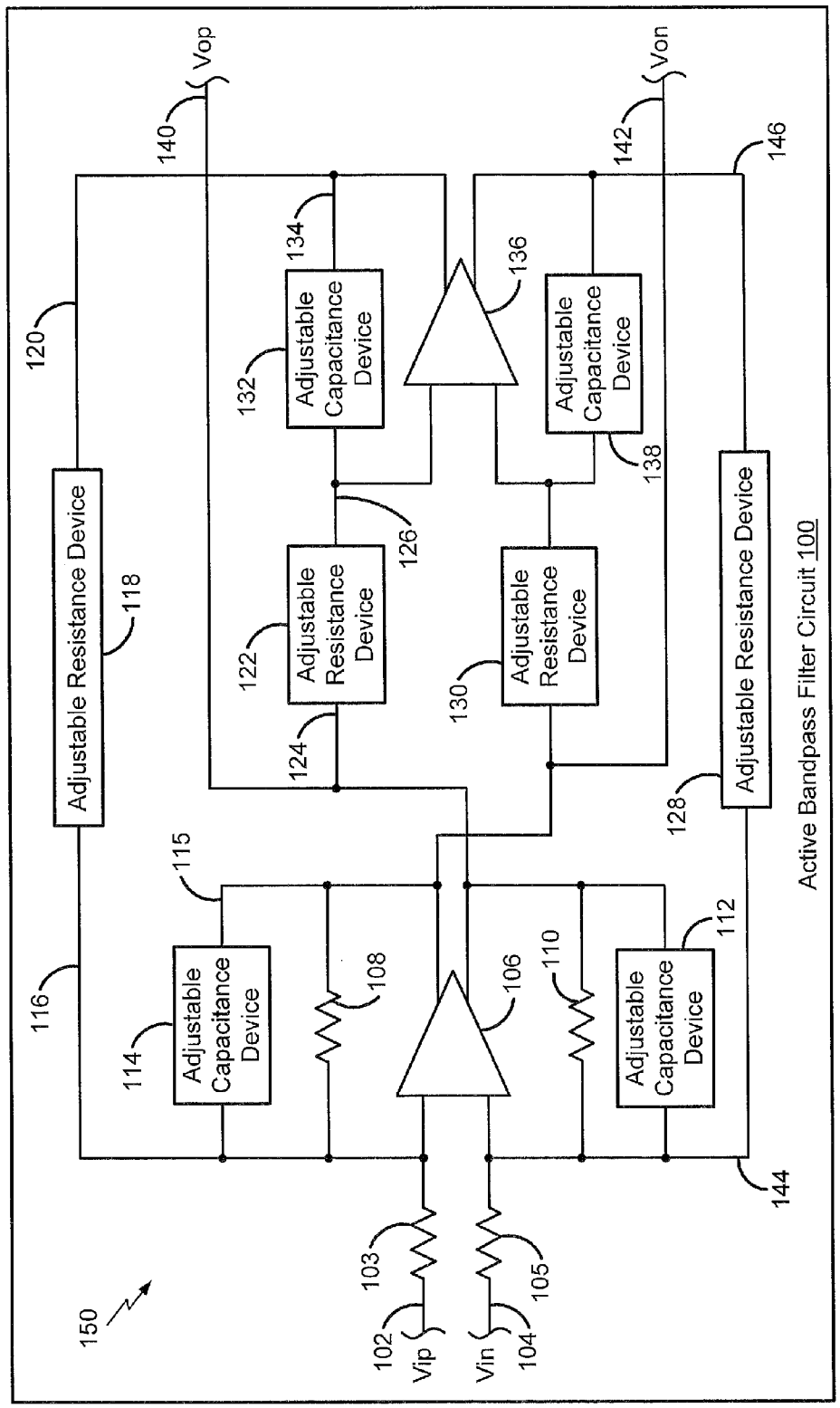
FIG. 1 is a diagram that illustrates certain aspects of an active bandpass filter circuit that includes an adjustable resistance device and an adjustable capacitance device.

Referring to FIG. 1, particular illustrative aspects of an example of an active bandpass filter circuit are depicted and generally designated 100. The active bandpass filter circuit 100 may be included in a radio frequency (RF) device, such as an RF frontend component, as an illustrative example.

The active bandpass filter circuit 100 includes an operational amplifier 106. The operational amplifier 106 may be coupled to a resistor 103 and to a resistor 105. The resistor 103 may be coupled to a first input terminal 102, and the resistor 105 may be coupled to a second input terminal 104. The first input terminal 102 may be configured to receive a first input signal Vip, and the second input terminal 104 may be configured to receive a second input signal Vin. The input signals Vip, Vin may correspond to a differential signal.

The active bandpass filter circuit 100 may also include a feedback resistor 108 and a feedback resistor 110. The feedback resistor 108 may be coupled to an input of the operational amplifier 106 and to an output of the operational amplifier 106, and the feedback resistor 110 may be coupled to another input of the operational amplifier 106 and to another output of the operational amplifier 106.

The active bandpass filter circuit 100 further includes an adjustable capacitance device 114. The adjustable capacitance device 114 may be coupled to the operational amplifier 106, such as via a node 115 and via a node 116.

The active bandpass filter circuit 100 further includes an adjustable resistance device 118. The adjustable resistance device 118 may be coupled to the operational amplifier 106 via the node 116. The adjustable resistance device 118 may be coupled to a node 120.

The active bandpass filter circuit 100 further includes an adjustable resistance device 122. The adjustable resistance device 122 may be coupled to the operational amplifier 106, such as via a node 124.

The active bandpass filter circuit 100 further includes an adjustable capacitance device 132. The adjustable capacitance device 132 may be coupled to the adjustable resistance device 122, such as via a node 126.

FIG. 1 also depicts that the active bandpass filter circuit 100 may further include an operational amplifier 136. The operational amplifier 136 may be coupled to the adjustable resistance device 122 and to the adjustable capacitance device 132, such as via the node 126. The operational amplifier 136 may also be coupled to the adjustable capacitance device 132 via a node 134.

The active bandpass filter circuit 100 may further include an adjustable resistance device 128 that is coupled to the operational amplifiers 106, 136. FIG. 1 also illustrates that an adjustable resistance device 130 may be coupled to the operational amplifiers 106, 136. An adjustable capacitance device 112 may be coupled to the operational amplifier 106. An adjustable capacitance device 138 may be coupled to the adjustable resistance devices 128, 130 and to the operational amplifier 136.

The operational amplifiers 106, 136, the adjustable resistance devices 118, 122, 128, and 130, the adjustable capacitance devices 112, 114, 132, and 138, and the resistors 103, 105, 108, and 110 may be included in a device, such as a biquadratic cell 150 of the active bandpass filter circuit 100. The biquadratic cell 150 may further include a first output terminal 140 and a second output terminal 142. The first output terminal 140 may be configured to generate a first output signal Vop, and the second output terminal 142 may be configured to generate a second output signal Von. The output signals Vop, Von may correspond to a differential signal.

During operation, the adjustable resistance devices 118, 122, 128, and 130 are configured to adjust (e.g., tune) a center frequency of the active bandpass filter circuit 100. For example, each of the adjustable resistance devices 118, 122, 128, and 130 may receive a set of control signals to set a resistance of the adjustable resistance device 118 to modify the center frequency. In a non-limiting illustrative example, the center frequency of the active bandpass filter circuit 100 is adjustable within a range of approximately 700 megahertz (MHz) to approximately 3 gigahertz (GHz). An illustrative implementation of an adjustable resistance device is described further with reference to FIG. 2.

In addition, the adjustable capacitance devices 112, 114, 132, and 138 are configured to adjust (e.g., tune) the center frequency and a bandwidth of the active bandpass filter circuit 100. For example, each of the adjustable capacitance devices 112, 114, 132, and 138 may receive a set of control signals to set a capacitance of the adjustable capacitance device 114 to modify the center frequency and the bandwidth. An illustrative implementation of an adjustable capacitance device is described further with reference to FIG. 3.

In an illustrative example, the adjustable resistance devices 118, 122, 128 and 130 are configured to adjust the center frequency of the active bandpass filter circuit 100 without modifying or without substantially modifying the bandwidth of the active bandpass filter circuit 100. In this case, the center frequency may be adjusted independently of the bandwidth. Further, in some implementations, the bandwidth may be adjusted over a relatively wide range without substantially modifying the center frequency. As used herein, "substantially modifying" the center frequency or the bandwidth may refer to a change from a first value that is compatible with a particular aspect of a wireless network (e.g., a communication channel in a wireless network) to a second value that is not compatible with the particular aspect. To illustrate, the center frequency (or the bandwidth) is not substantially modified by adjusting the center frequency (or the bandwidth) from a first value to a second value if both the first value and the second value are compatible with wireless communications using a particular communication channel of a wireless network.

To further illustrate, the center frequency of the active bandpass filter circuit 100 may be represented mathematically as k1/(Rf*Cf), where k1 indicates a first proportionality value, where Rf indicates a resistance that is based on resistances of the adjustable resistance devices 118, 122, 128, and 130, and where Cf indicates a capacitance that is based on capacitances of the adjustable capacitance devices 112, 114, 132, and 138. The bandwidth of the active bandpass filter circuit 100 may be represented mathematically as k2/(Rq*Cf), where k2 indicates a second proportionality value, and where Rq indicates a resistance of the feedback resistors 108, 110. Accordingly, Rf may be modified (using the adjustable resistance devices 118, 122, 128, and 130) to adjust the center frequency of the active bandpass filter circuit 100 without modifying Rq and Cf (and therefore without modifying the bandwidth of the active bandpass filter circuit 100). Further, Cf may be modified (using the adjustable capacitance devices 112, 114, 132, and 138) to adjust the center frequency and the bandwidth of the active bandpass filter circuit 100.

In an illustrative example, the adjustable resistance devices 118, 122, 128 and 130 are configured to adjust the center frequency of the active bandpass filter circuit 100 by a first amount, and the adjustable capacitance devices 112, 114, 132, and 138 are configured to adjust the center frequency of the active bandpass filter circuit 100 by a second amount that is less than the first amount. For example, the adjustable resistance devices 118, 122, 128, and 130 may be configured to perform a coarse adjustment of the center frequency of the active bandpass filter circuit 100, and the adjustable capacitance devices 112, 114, 132, and 138 may be configured to perform a fine adjustment of the center frequency of the active bandpass filter circuit 100. Illustrative aspects of coarse and fine adjustment of the center frequency of the active bandpass filter circuit 100 are described further with reference to FIG. 6.

The active bandpass filter circuit 100 of FIG. 1 may improve performance of an electronic device. For example, the active bandpass filter circuit 100 may be relatively cost-effective and power-efficient (e.g., by using low complexity components, such as switches, resistors, capacitors, and varactors) while also enabling high precision of frequency band selection (e.g., by enabling adjustment of a center frequency substantially independently of a bandwidth, and vice versa).

Figure 2:
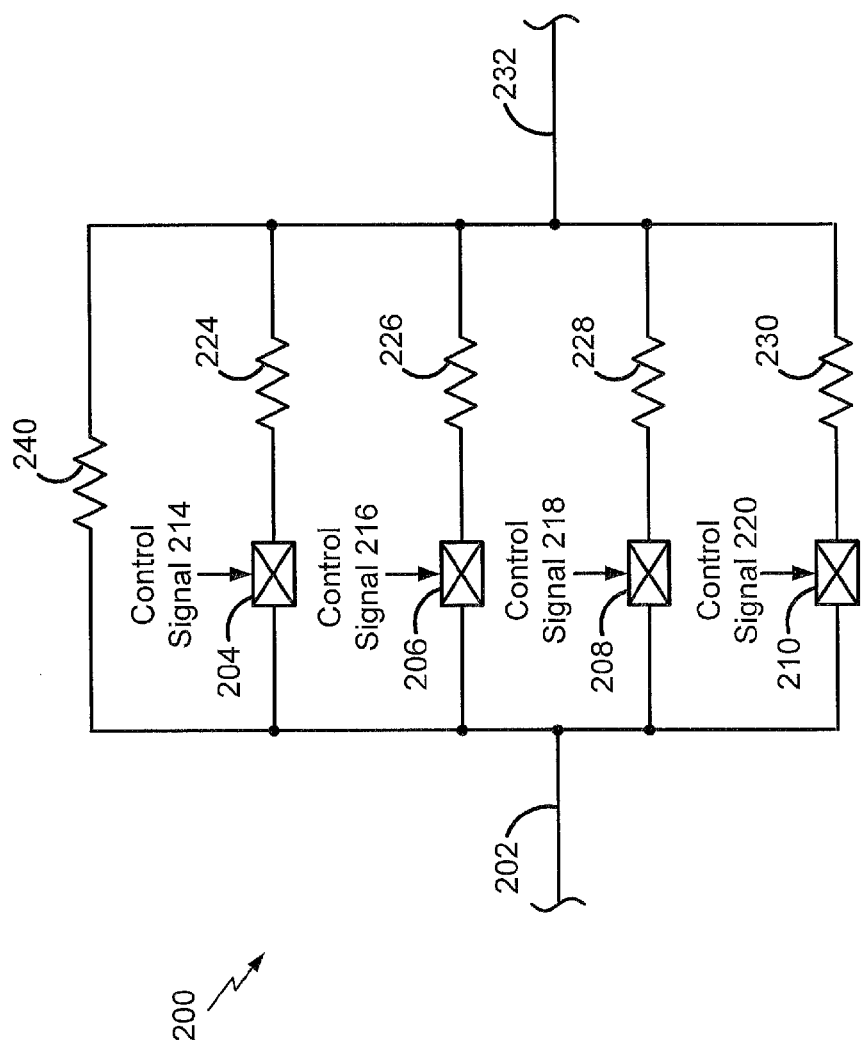
FIG. 2 is a diagram that illustrates an example of an adjustable resistance device that may be included in the active bandpass filter circuit of FIG. 1.

Referring to FIG. 2, a particular illustrative example of an adjustable resistance device is depicted and generally designated 200. For example, the adjustable resistance device 200 may correspond to one or more of the adjustable resistance devices 118, 122, 128, and 130 of FIG. 1. In an illustrative example, each of the adjustable resistance devices 118, 122, 128, and 130 includes a circuit corresponding to the adjustable resistance device 200.

The adjustable resistance device 200 includes a set of switches. For example, FIG. 2 depicts that the adjustable resistance device 200 may include a switch 204, a switch 206, a switch 208, and a switch 210. The switches 204, 206, 208, and 210 may be configured to receive a set of control signals, such as a control signal 214, a control signal 216, a control signal 218, and a control signal 220. The switches 204, 206, 208, and 210 may be coupled to an input terminal 202 of the adjustable resistance device 200. In an illustrative implementation, the switches 204, 206, 208, and 210 each include a transistor, such as a metal-oxide-semiconductor field-effect transistor (MOSFET), as an illustrative example. In another implementation, the switches 204, 206, 208, and 210 each include a microelectromechanical systems (MEMS) device. Alternatively, the switches 204, 206, 208, and 210 may include another device.

The adjustable resistance device 200 further includes a set of resistors. For example, the adjustable resistance device 200 may include a resistor 224, a resistor 226, a resistor 228 and a resistor 230. The resistor 224 is coupled to the switch 204, and the resistor 226 is coupled to the switch 206. In addition, the resistor 228 is coupled to the switch 208 and the resistor 230 is coupled to the switch 210. The resistors 224, 226, 228, and 230 are coupled to an output terminal 232 of the adjustable resistance device 200.

The adjustable resistance device 200 may also include a resistor 240. FIG. 2 illustrates that a first terminal of the resistor 240 is coupled to the input terminal 202 and that a second terminal of the resistor 240 is coupled to the output terminal 232.

In an illustrative example, the input terminal 202 corresponds to the node 116 of FIG. 1, and the output terminal 232 corresponds to the node 120 of FIG. 1. In another illustrative example, the input terminal 202 corresponds to the node 124 of FIG. 1, and the output terminal 232 corresponds to the node 126 of FIG. 1. Alternatively or in addition, the terminals 202, 232 may correspond to other nodes of the active bandpass filter circuit 100.

During operation, the switches 204, 206, 208 and 210 are configured to selectively couple the resistors 224, 226, 228, and 230 to the input terminal 202 based on the control signals 214, 216, 218, and 220 to set a resistance of the adjustable resistance device 200. As an illustrative example, a first value of the control signal 214 may activate the switch 204 to connect the resistor 224 to the input terminal 202. As another example, a second value of the control signal 214 may deactivate the switch 204 to decouple the resistor 224 from the input terminal 202. In an illustrative non-limiting example, the adjustable resistance device 200 has a range of adjustable resistances from 300 Ohms to 2000 Ohms. It is noted that the control signals 214, 216, 218, and 220 may be provided to each of the adjustable resistance devices 118, 122, 128, and 130 (e.g., so that resistances of the adjustable resistance devices 118, 122, 128, 130 are equal or substantially equal).

Accordingly, FIG. 2 illustrates that resistance of the adjustable resistance device 200 may be controlled using the control signals 214, 216, 218, and 220. The resistance of the adjustable resistance device 200 may be adjusted to determine a center frequency of the active bandpass filter circuit 100 of FIG. 1.

In the example of FIG. 2, the adjustable resistance device 200 includes four switches and four resistors. In this example, the adjustable resistance device 200 may have one of 16 different selectable resistances. In other implementations, the adjustable resistance device 200 may include a different number of switches and resistors, such as two switches and two resistors, three switches and three resistors, five switches and five resistors, or another number switches and resistors.

Figure 3:
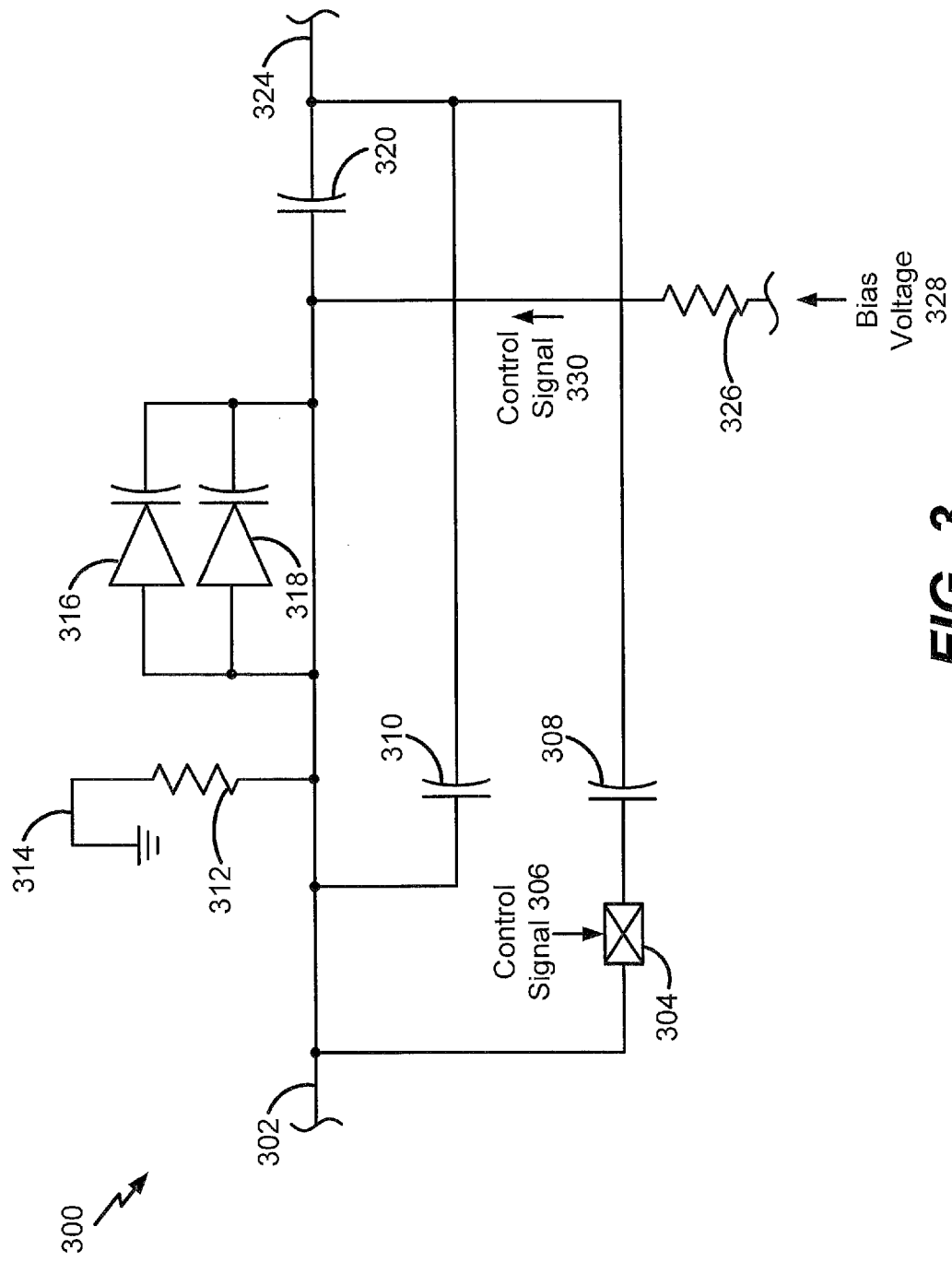
FIG. 3 is a diagram that illustrates an example of an adjustable capacitance device that may be included in the active bandpass filter circuit of FIG. 1.

Referring to FIG. 3, an illustrative example of an adjustable capacitance device is depicted and generally designated 300. For example, the adjustable capacitance device 300 may correspond to one or more of the adjustable capacitance devices 112, 114, 132, and 138 of FIG. 1. Alternatively or in addition, the adjustable capacitance device 300 may correspond to the adjustable capacitance device 132 of FIG. 1. In an illustrative example, each of the adjustable capacitance devices 112, 114, 132, and 138 includes a circuit corresponding to the adjustable capacitance device 300.

The adjustable capacitance device 300 includes one or more varactors, such as a varactor 316 and a varactor 318. The varactors 316, 318 are coupled to a resistor 326 (e.g., a choke resistor). For example, cathode terminals of the varactors 316, 318 may be coupled to the resistor 326. Anode terminals of the adjustable capacitance device may be coupled to an input terminal 302 of the adjustable capacitance device 300.

The resistor 326 is configured to receive a bias voltage 328 (e.g., a positive bias voltage) and to provide a control signal 330 to the varactors 316, 318 based on the bias voltage 328. The varactors 316, 318 may be configured to adjust the center frequency of the active bandpass filter circuit 100 without substantially modifying the bandwidth of the active bandpass filter circuit 100, such as if a relatively small capacitance change of the varactors 316, 318 results in small or negligible change in the bandwidth.

The adjustable capacitance device further includes one or more capacitors, such as a capacitor 310 and a capacitor 308 (e.g., a switchable capacitor). The capacitors 308, 310 may be coupled in parallel to the varactors 316, 318. The adjustable capacitance device 300 may further include a capacitor 320.

The adjustable capacitance device 300 may also include a switch 304. The switch 304 is coupled to the input terminal 302 of the adjustable capacitance device 300. The switch 304 may be configured to receive a control signal 306. The control signal 306 may selectively couple the capacitor 308 to the input terminal 302. For example, a first value of the control signal 306 may activate the switch 304 to couple the capacitor 308 to the input terminal 302. As another example, a second value of the control signal 306 may deactivate the switch 304 to decouple the capacitor 308 from the input terminal 302. In an illustrative implementation, the switch 304 includes a transistor, such as a MOSFET, as an illustrative example. In another implementation, the switch 304 includes a MEMS device. Alternatively, the switch 304 may include another device.

FIG. 3 also depicts that the capacitor 308 may be coupled to an output terminal 324 of the adjustable capacitance device 300. A resistor 312 may be coupled to the input terminal 302. The resistor 312 may be coupled to a ground node 314.

In an illustrative example, the input terminal 302 of FIG. 3 corresponds to the node 116 of FIG. 1, and the output terminal 324 corresponds to the node 115 of FIG. 1. In another example, the input terminal 302 corresponds to the node 126, and the output terminal 324 corresponds to the node 134. Alternatively or in addition, the terminals 302, 324 may correspond to other nodes of the active bandpass filter circuit 100.

During operation, the bias voltage 328 may be adjusted to control operation of the varactors 316, 318. For example, the resistor 326 may receive the bias voltage 328 and may generate the control signal 330 based on the bias voltage 328. The resistor 326 may provide the control signal 330 to the varactors 316, 318 to determine a capacitance of the adjustable capacitance device 300. In an illustrative non-limiting example, the bias voltage 328 may be adjusted from between 0.5 volts (V) and 3 V (e.g., using a voltage divider network, as an illustrative example). In an illustrative non-limiting example, the bias voltage 328 may be adjusted in increments of 0.2 V (e.g., from 0.5 V to 0.7 V or from 3 V to 2.8 V).

Alternatively or in addition, the value of control signal 306 may be adjusted to control the switch 304 in order to set a capacitance of the adjustable capacitance device 300. For example, a first value of the control signal 306 may cause the switch 304 to selectively couple the capacitor 308 to the input terminal 302. As another example, a second value of the control signal 306 may cause the switch 304 to decouple the switch 304 from the input terminal 302. It is noted that the control signal 306 and the bias voltage 328 may be provided to each of the adjustable capacitance devices 112, 114, 132, and 138 (e.g., so that capacitances of the adjustable capacitance devices 112, 114, 132, and 138 are equal or substantially equal).

In an illustrative example, the varactors 316, 318 may be configured to perform a fine adjustment of the center frequency of the active bandpass filter circuit 100 (e.g., without substantially modifying the bandwidth of the active bandpass filter circuit 100). The fine adjustment may be performed in connection with a coarse adjustment of the center frequency performed by an adjustable resistance device, such as any of the adjustable resistance devices 118, 122, 128, 130, and 200. Further, the switch 304 may be configured to perform a discrete adjustment of the center frequency by selectively coupling the capacitor 308 to the input terminal 302.

Accordingly, FIG. 3 illustrates that capacitance of the adjustable capacitance device 300 may be controlled using the bias voltage 328, the control signal 306, or both. The capacitance of the adjustable capacitance device 300 may be adjusted to determine a center frequency and a bandwidth of the active bandpass filter circuit 100 of FIG. 1.

Although the example of FIG. 3, illustrates one switch (the switch 304, it should be appreciated that multiple switches may be used to selectively coupled multiple capacitors to the input terminal 302. For example, the switch 304 may correspond to a plurality of switches, and the capacitor 308 may correspond to a plurality of capacitors coupled in series, a plurality of capacitors coupled in parallel, or a combination thereof.

Figure 4:
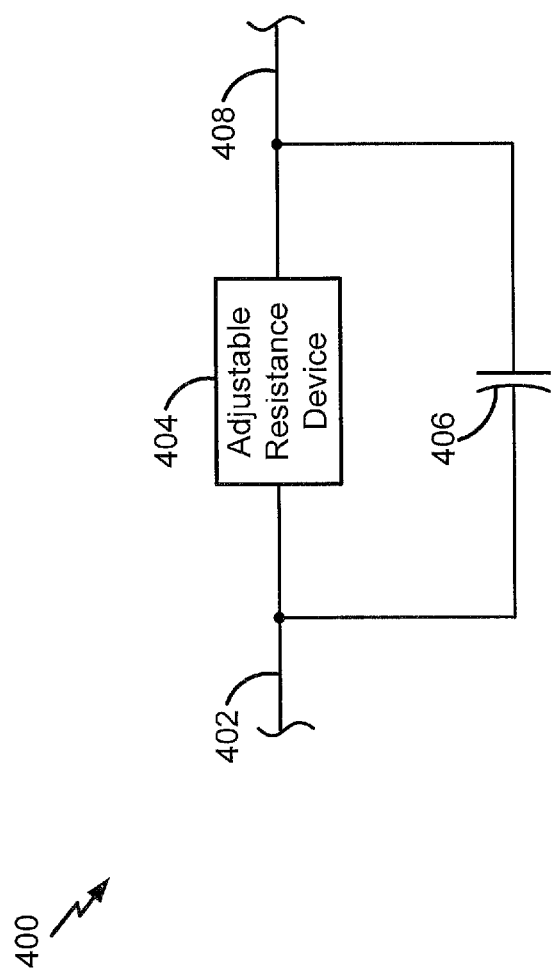
FIG. 4 is a diagram that illustrates an example of a circuit that may be included in the active bandpass filter circuit of FIG. 1.

Referring to FIG. 4, an illustrative example of a circuit is depicted and generally designated 400. The circuit 400 includes an adjustable resistance device 404. The adjustable resistance device 404 may correspond to one or more of the adjustable resistance devices 118, 122, 128, 130, and 200.

The adjustable resistance device 404 is coupled to a capacitor 406. For example, the adjustable resistance device 404 may be coupled in parallel to the capacitor 406, such as via an input terminal 402 and via an output terminal 408.

In an illustrative example, the input terminal 402 corresponds to one or more of the node 116, the node 124, or the input terminal 202. In an illustrative example, the output terminal 408 corresponds to one or more of the node 120, the node 126, or the output terminal 232.

During operation, the capacitor 406 is configured to stabilize operation of the active bandpass filter circuit 100 of FIG. 1. For example, the capacitor 406 may be configured to reduce or prevent oscillations of the active bandpass filter circuit during adjustment of the center frequency and the bandwidth of the active bandpass filter circuit 100. The capacitor 406 may determine a phase margin associated with the active bandpass filter circuit 100. In an illustrative non-limiting example, the capacitor 406 has a capacitance of between 10 femtofarads (fF) and 45 fF.

The example of FIG. 4 illustrates that a stabilization capacitor (e.g., the capacitor 406) may increase stability of the active bandpass filter circuit 100. As a result, operation of the active bandpass filter circuit 100 may be improved.

Figure 5:
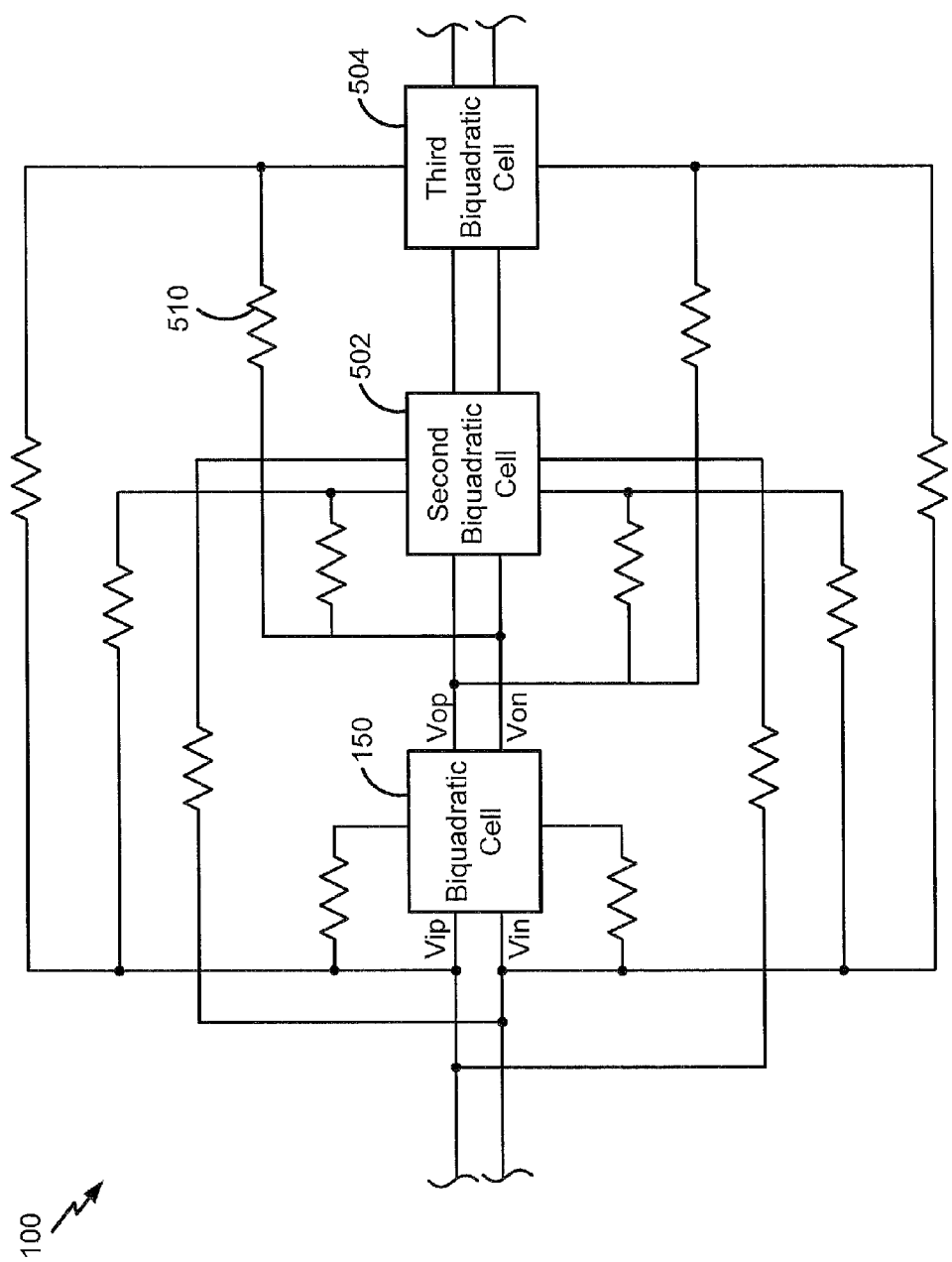
FIG. 5 is a diagram that illustrates an example of the active bandpass filter circuit of FIG. 1.

FIG. 5 depicts aspects of an illustrative example of the active bandpass filter circuit 100. The active bandpass filter circuit 100 includes the biquadratic cell 150.

The active bandpass filter circuit 100 may include one or more other biquadratic cells. For example, FIG. 5 illustrates that the active bandpass filter circuit 100 may include a second biquadratic cell 502 and a third biquadratic cell 504. Components and operation of one or both of the biquadratic cells 502, 504 may be as described with reference to the biquadratic cell 150.

The active bandpass filter circuit 100 may include a set of resistors. As an example, the active bandpass filter circuit 100 may include a resistor 510 coupled to the biquadratic cells 150, 502, and 504. It is noted that a resistance value of a resistor described herein may be selected based on the particular application. Further, in some cases, a bandpass filter circuit may include more resistors or fewer resistors than as described herein. For example, resistance values and the particular number of resistors of the active bandpass filter circuit 100 may be selected to enable a particular stability, a particular band rejection, a particular noise figure, a particular attenuation, another characteristic, or a combination thereof.

The biquadratic cell 150, the second biquadratic cell 502, and the third biquadratic cell 504 are configured to set a transfer function of the active bandpass filter circuit 100. To illustrate in the example of FIG. 5, the active bandpass filter circuit 100 has a third order configuration due to including three biquadratic cells. In other implementations the active bandpass filter circuit 100 may have another configuration, such as a first order configuration, a second order configuration, a forth order configuration, or another configuration.

During operation, the biquadratic cell 150 may receive the control signals 214, 216, 218, 220, and 306 and the bias voltage 328 of FIGS. 2 and 3. For example, each of the adjustable resistance devices 118, 122, 128, and 130 may receive the control signals 214, 216, 218, and 220. As another example, each of the adjustable capacitance devices 112, 114, 132, and 138 may receive the control signal 306 and the bias voltage 328.

In an illustrative implementation, capacitances of the biquadratic cells 150, 502, and 504 are independently adjustable, and resistances of the biquadratic cells 150, 502, and 504 are independently adjustable. For example, the second biquadratic cell 502 may receive control signals and bias voltages having different values than the control signals 214, 216, 218, 220, and 306 and the bias voltage 328. As another example, the third biquadratic cell 504 may receive control signals and bias voltages having different values than the control signals 214, 216, 218, 220, and 306 and the bias voltage 328.

The biquadratic cells 150, 502, and 504 may determine one or more of a center frequency or a bandwidth of the active bandpass filter circuit 100. As an illustrative example, values of center frequencies of the biquadratic cells 150, 502, and 504 may be "mismatched," such as if a first center frequency of the biquadratic cell 150 is different than a second center frequency of the second biquadratic cell 502 (and if the second center frequency is different than a third center frequency of the third biquadratic cell 504). In this example, a bandwidth of the active bandpass filter circuit 100 may be adjusted (e.g., tuned) by adjusting center frequencies of the biquadratic cells 150, 502, and 504.

The example of FIG. 5 illustrates that a configuration of the active bandpass filter circuit 100 may be selected based on a particular application. For example, a number of biquadratic cells of the active bandpass filter circuit 100 may be selected to achieve a particular transfer function based on the particular application.

Figure 6:
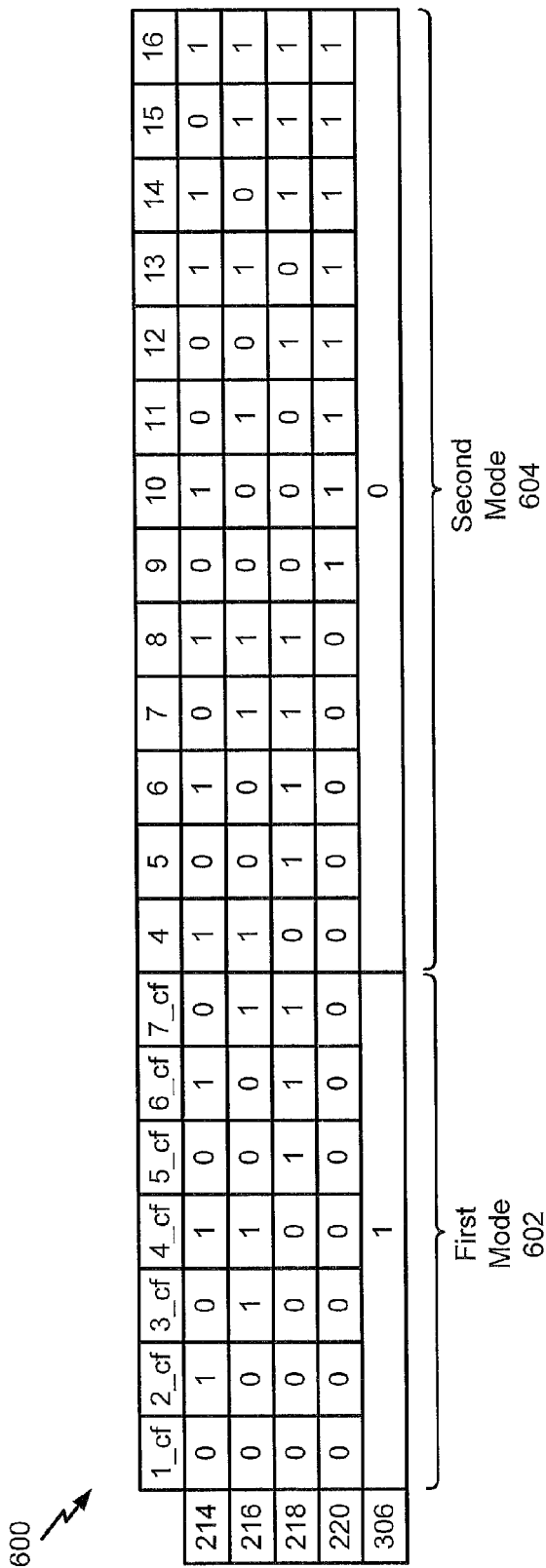
FIG. 6 is a diagram that illustrates an example of a table that may be associated with operation of the active bandpass filter circuit of FIG. 1.

FIG. 6 illustrates an example of a table 600. The table 600 depicts illustrative examples of values of the control signals 214, 216, 218, 220, and 306. Aspects of the table 600 may be used in connection with operation of one or more of the adjustable resistance devices 118, 122, 128, 130, 200, and 404, one or more of the adjustable capacitance devices 112, 114, 132, 138, and 300, or a combination thereof.

The table 600 illustrates examples of a first mode 602 and a second mode 604. The first mode 602 may be associated with states 1_cf, 2_cf, . . . 7_cf, and the second mode 604 may be associated with states 4, 5, . . . 16. In an illustrative example, the first mode 602 corresponds to a first bandwidth of the active bandpass filter circuit 100, and the second mode 604 corresponds to a second bandwidth of the active bandpass filter circuit 100 that is greater than the first bandwidth.

During operation according to the first mode 602, the control signals 214, 216, 218, and 220 have a first value (e.g., a logic "0" value) or a second value (e.g., a logic "1" value), and the control signal 306 has the second value. To illustrate, during operation according to state 1_cf, the control signals 214, 216, 218, and 220 have a logic "0" value and the control signal 306 has a logic "1" value.

During operation according to the second mode 604, the control signals 214, 216, 218, and 220 have the first value (e.g., a logic "0" value) or the second value (e.g., a logic "1" value), and the control signal 306 has the first value. To illustrate, during operation according to state 16, the control signals 214, 216, 218, and 220 have a logic "1" value and the control signal 306 has a logic "0" value.

The active bandpass filter circuit 100 of FIG. 1 may operate in accordance with one or more aspects of the table 600 to adjust the center frequency and the bandwidth of the active bandpass filter circuit 100. To illustrate, the control signal 214 may be adjusted from a first value to a second value to change operation from state 3_cf to state 4_cf. Changing operation from state 3_cf to state 4_cf may modify the center frequency of the active bandpass filter circuit 100 by a first number of hertz (Hz).

During operation according to state 4_cf, a value of the control signal 306 may be adjusted from the second value to the first value to change operation from state 4_cf to state 4. Changing operation from state 4_cf to state 4 may modify the bandwidth of the active bandpass filter circuit 100.

The center frequency of the active bandpass filter circuit 100 may be finely adjusted, such as by adjusting between adjacent states of the table 600. For example, the bias voltage 328 of FIG. 3 may be adjusted to modify capacitance of the varactors 316, 318. Modifying the capacitance of the varactors 316, 318 may alter operation of the active bandpass filter circuit 100 from state 4 of the table 600 to state 5 of the table 600, as an illustrative example. Changing operation from state 4 to state 5 may modify the center frequency of the active bandpass filter circuit 100 by a second number of Hz that is less than the first number of Hz.

The example of FIG. 6 illustrates that center frequency and bandwidth may be adjusted to control operation of the active bandpass filter circuit 100 of FIG. 1. For example, aspects of the table 600 may be used to perform a fine center frequency adjustment, to perform a fine center frequency adjustment, to perform a bandwidth adjustment, or a combination thereof.

Figure 7:
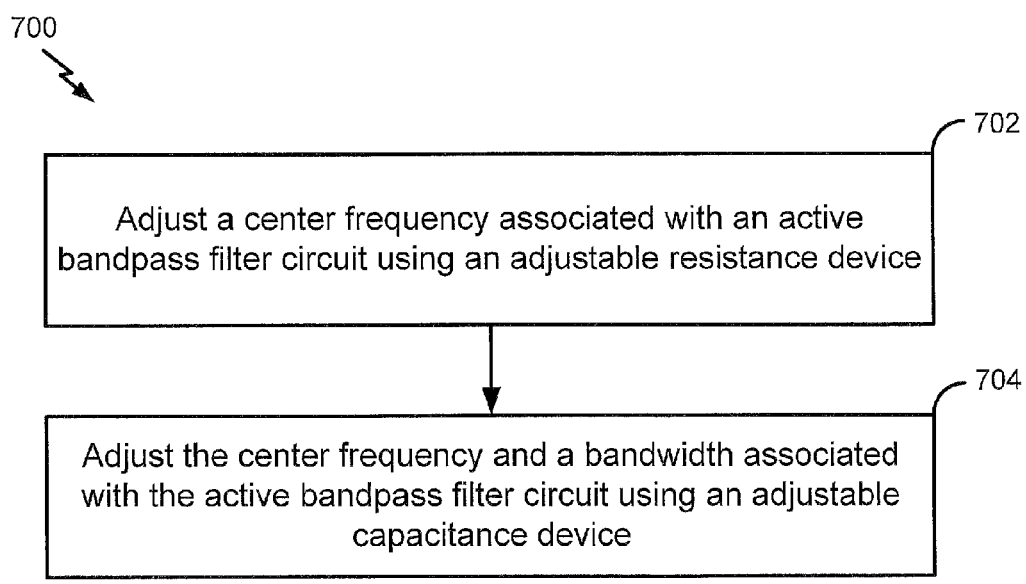
FIG. 7 is a flow chart illustrating an example of a method of operation of the active bandpass filter circuit of FIG. 1.

Referring to FIG. 7, an illustrative example of a method is depicted and generally designated 700. The method 700 may be performed using one or more components of the active bandpass filter circuit 100 of FIG. 1, the adjustable resistance device 200 of FIG. 2, the adjustable capacitance device 300 of FIG. 3, the circuit 400 of FIG. 4, the active bandpass filter circuit 100 of FIG. 5, or a combination thereof. Alternatively or in addition, the method 700 may be performed in accordance with one or more aspects of the table 600 of FIG. 6.

The method 700 includes adjusting a center frequency associated with an active bandpass filter circuit using an adjustable resistance device, at 702. For example, the active bandpass filter circuit may correspond to the active bandpass filter circuit 100, and the adjustable resistance device may correspond to the adjustable resistance device 118, the adjustable resistance device 122, the adjustable resistance device 128, the adjustable resistance device 130, the adjustable resistance device 200, the adjustable resistance device 404, or a combination thereof.

The method 700 further includes adjusting the center frequency and a bandwidth associated with the active bandpass filter circuit using an adjustable capacitance device, at 704. For example, the adjustable capacitance device may correspond to the adjustable capacitance device 112, the adjustable capacitance device 114, the adjustable capacitance device 132, the adjustable capacitance device 138, the adjustable capacitance device 300, or a combination thereof.

The method 700 may include receiving a set of control signals at a set of switches of the adjustable resistance device. For example, the control signals 214, 216, 218, and 220 may be received at the switches 204, 206, 208, and 210. In this example, adjusting the center frequency includes selectively coupling the resistors 224, 226, 228, and 230 to the input terminal 202 using the switches 204, 206, 208, and 210 based on the control signals 214, 216, 218, and 220.

The method 700 may include receiving a bias voltage at a resistor of the adjustable capacitance device. For example, the bias voltage 328 may be received at the resistor 326 of the adjustable capacitance device 300. The method 700 may further include providing a control signal to a varactor of the adjustable capacitance device to adjust the center frequency and the bandwidth based on the bias voltage. For example, one or both of the varactors 316, 318 may receive a control signal from the resistor 326 based on the bias voltage 328 to adjust the center frequency and the bandwidth.

Figure 8:
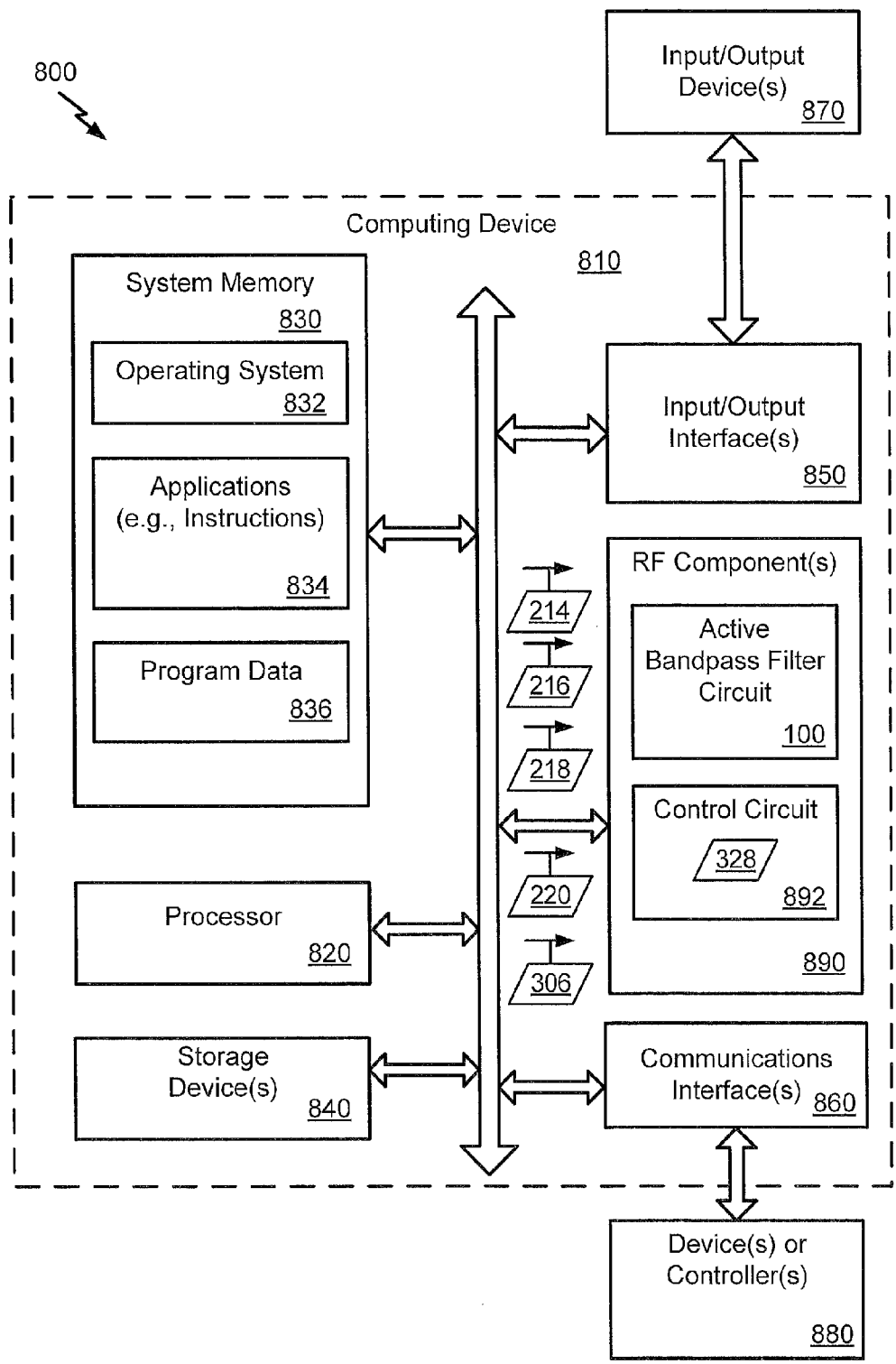
FIG. 8 is an illustration of a block diagram of a computing environment including a general purpose computing device configured to support embodiments of computer-implemented methods and computer-executable program instructions (or code) according to the present disclosure.

FIG. 8 is an illustration of a block diagram of a computing environment 800 including a general purpose computing device 810 configured to support embodiments of computer-implemented methods and computer-executable program instructions (or code) according to the present disclosure. For example, the computing device 810, or portions thereof, may execute instructions to perform the operations described herein with respect to the method 700 of FIG. 7. The computing device 810, or portions thereof, may further execute instructions according to any of the methods described herein.

The computing device 810 may include one or more radio frequency (RF) components 890. The one or more RF components 890 may include the active bandpass filter circuit 100. As an illustrative example, the active bandpass filter circuit 100 may be included in an RF frontend component of the one or more RF components 890.

The computing device 810 may include a processor 820. The processor 820 may communicate with the system memory 830, one or more storage devices 840, one or more input/output interfaces 850, one or more communications interfaces 860, or a combination thereof. The system memory 830 may include volatile memory devices (e.g., random access memory (RAM) devices), nonvolatile memory devices (e.g., read-only memory (ROM) devices, programmable read-only memory, and flash memory), or both. The system memory 830 may store an operating system 832, which may include a basic/input output system for booting the computing device 810 as well as a full operating system to enable the computing device 810 to interact with users, other programs, and other devices. The system memory 830 may store system data 836.

The system memory 830 may include one or more applications 834 executable by the processor 820. As an example, the one or more applications 834 may include instructions executable by the processor 820 to initiate control, or perform one or more operations described herein, such as one or more operations of the method 700 of FIG. 7. As an illustrative example, the one or more applications 834 may include instructions executable by the processor 820 to generate the control signals 214, 216, 218, 220, and 306 in connection with operation of the one or more RF components 890 (e.g., in connection with wireless communications in a wireless communication network). Alternatively or in addition, the instructions may be executable by the processor 820 to initiate generating the bias voltage 328, such as by providing a control signal to a control circuit 892 (e.g., an analog control circuit) that is configured to generate a range of bias voltages that includes the bias voltage 328. The control circuit 892 may be configured to provide the bias voltage 328 to the active bandpass filter circuit 100, such as by providing the bias voltage 328 to the resistor 326 of FIG. 3 to generate the control signal 330.

The processor 820 may also communicate with one or more storage devices 840. For example, the one or more storage devices 840 may include nonvolatile storage devices, such as magnetic disks, optical disks, or flash memory devices. The storage devices 840 may include both removable and non-removable memory devices. The storage devices 840 may be configured to store an operating system, images of operating systems, applications, and program data. In a particular embodiment, the system memory 830, the storage devices 840, or both, include tangible computer-readable media.

The processor 820 may also communicate with one or more input/output interfaces 850 that enable the computing device 810 to communicate with one or more input/output devices 870 to facilitate user interaction. The processor 820 may detect interaction events based on user input received via the input/output interfaces 850. Additionally, the processor 820 may send a display to a display device via the input/output interfaces 850. The processor 820 may communicate with devices or controllers 880 via the one or more communications interfaces 860.

In an illustrative example, a non-transitory computer-readable storage medium (e.g., the system memory 830) includes instructions that, when executed by a processor (e.g., the processor 820), cause the processor to initiate operations. The operations include providing a set of control signals (e.g., the control signals 214, 216, 218, 220, and 306) to an adjustable resistance device (e.g., any of the adjustable resistance devices 118, 122, 128, 130, 200, and 404) to adjust a center frequency associated with an active bandpass filter circuit (e.g., the active bandpass filter circuit 100). The operations further include providing a bias voltage (e.g., the bias voltage 328) to an adjustable capacitance device (e.g., any of the adjustable capacitance devices 112, 114, 132, 138, and 300) to adjust a bandwidth associated with the active bandpass filter circuit and to adjust the center frequency. In an illustrative example, adjusting the center frequency using the adjustable resistance device does not substantially modify the bandwidth.

A component described herein may be fabricated using one or more processes. As an example, the active bandpass filter circuit 100 may be fabricated using a semiconductor process, such as a bipolar complementary metal-oxide-semiconductor (BiCMOS) process, a silicon germanium (SiGe) process, or both (i.e., using a SiGe BiCMOS process). In some implementations, the active bandpass filter circuit 100 is fabricated within a monolithic device, such as a monolithic integrated circuit. In some circumstances, fabrication of the active bandpass filter circuit 100 using a SiGe process may improve performance, linearity, circuitry density, or power efficiency of the active bandpass filter circuit 100 as compared to another process. In other implementations, another process may be used to fabricate the active bandpass filter circuit 100.

Embodiments described above are illustrative and do not limit the disclosure. It is to be understood that numerous modifications and variations are possible in accordance with the principles of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A device comprising:
   an operational amplifier of an active bandpass filter circuit, the operational amplifier including a first output and a second output;
   an adjustable resistance device coupled to the operational amplifier and configured to adjust a center frequency of the active bandpass filter circuit; and
   an adjustable capacitance device coupled to an input of the operational amplifier and to the first output of the operational amplifier, the adjustable capacitance device configured to adjust the center frequency and a bandwidth of the active bandpass filter circuit.

2. The device of claim 1, wherein the adjustable resistance device is further configured to adjust the center frequency without substantially modifying the bandwidth.

3. The device of claim 1, wherein the adjustable resistance device includes a set of resistors and a set of switches, wherein the set of switches is coupled to an input terminal of the adjustable resistance device, wherein the set of resistors is coupled to an output terminal of the adjustable resistance device, and wherein the set of switches is configured to selectively couple the set of resistors to the input terminal based on a set of control signals.

4. The device of claim 1, wherein the adjustable capacitance device includes a varactor and a resistor that is coupled to the varactor, wherein the resistor is configured to:
   receive a bias voltage;
   generate a control signal based on the bias voltage; and
   provide the control signal to the varactor, the control signal configured to adjust the center frequency.

5. The device of claim 4, wherein the adjustable capacitance device further includes a switch and includes one or more capacitors coupled to the varactor in parallel, wherein the switch is configured to couple a particular capacitor of the one or more capacitors to the varactor based on a second control signal, and wherein the control signal is configured to adjust the center frequency and the bandwidth.

6. The device of claim 1, wherein the adjustable resistance device is configured to adjust the center frequency by a first amount, wherein the adjustable capacitance device is further configured to adjust the center frequency by a second amount that is less than the first amount, and wherein the adjustable capacitance device is in a feedback loop of the operational amplifier.

7. The device of claim 1, further comprising a capacitor coupled in parallel with the adjustable resistance device, the capacitor configured to reduce oscillations of the active bandpass filter circuit during adjustment of the center frequency and the bandwidth.

8. The device of claim 1, further comprising a first biquadratic cell of the active bandpass filter circuit, the first biquadratic cell including the operational amplifier, the adjustable resistance device, and the adjustable capacitance device.

9. The device of claim 8, further comprising at least a second biquadratic cell of the active bandpass filter circuit, wherein the first biquadratic cell and the second biquadratic cell are configured to set a transfer function of the active bandpass filter circuit.

10. The device of claim 1, further comprising a second operational amplifier of the active bandpass filter circuit having a first input coupled to the second output of the operational amplifier, having a second input coupled to the first output of the operational amplifier, having a first output coupled to the second input of the operational amplifier, and having a second output coupled to the input of the operational amplifier.

11. The device of claim 1, further comprising a second adjustable resistance device of the active bandpass filter circuit coupled to a second input of the operational amplifier and to the first output of the operational amplifier, wherein the adjustable resistance device is coupled to the input of the operational amplifier and to the second output of the operational amplifier.

12. The device of claim 11, further comprising a second adjustable capacitance device of the active bandpass filter circuit coupled to the second input of the operational amplifier and to the second output of the operational amplifier, wherein the adjustable capacitance device is coupled to the input of the operational amplifier and to the first output of the operational amplifier.

13. The device of claim 12, further comprising:
   a third adjustable resistance device of the active bandpass filter circuit coupled to the input of the operational amplifier and to the second output of the operational amplifier; and
   a third adjustable capacitance device of the active bandpass filter circuit coupled to the input of the operational amplifier and to the second output of the operational amplifier.

14. The device of claim 13, further comprising:
   a fourth adjustable resistance device of the active bandpass filter circuit coupled to the second input of the operational amplifier and to the first output of the operational amplifier; and a fourth adjustable capacitance device of the active bandpass filter circuit coupled to the second input of the operational amplifier and to the first output of the operational amplifier.

15. A method comprising:
adjusting a center frequency of an active bandpass filter circuit using an adjustable resistance device of the active bandpass filter circuit, the adjustable resistance device coupled to a first output of an operational amplifier of the active bandpass filter circuit; and
adjusting the center frequency and a bandwidth of the active bandpass filter circuit using an adjustable capacitance device of the active bandpass filter circuit, the adjustable capacitance device coupled to an input of the operational amplifier and to a second output of the operational amplifier.

16. The method of claim 15, further comprising receiving a set of control signals at a set of switches of the adjustable resistance device, wherein adjusting the center frequency includes, based on the set of control signals, selectively connecting, using the set of switches, a set of resistors of the adjustable resistance device to an input terminal of the adjustable resistance device.

17. The method of claim 15, further comprising:
receiving a bias voltage at a resistor of the adjustable capacitance device; and
based on the bias voltage, providing a control signal to a varactor of the adjustable capacitance device to adjust the center frequency and the bandwidth.

18. The method of claim 15, wherein the adjustable resistance device, the adjustable capacitance device, and the operational amplifier are further coupled to a second operational amplifier of the active bandpass filter circuit.

19. A computer-readable storage medium including instructions that, when executed by a processor, cause the processor to initiate operations including:

providing a set of control signals to an adjustable resistance device of an active bandpass filter circuit to adjust a center frequency of the active bandpass filter circuit, the adjustable resistance device coupled to a first output of an operational amplifier of the active bandpass filter circuit; and providing a bias voltage to an adjustable capacitance device of the active bandpass filter circuit to adjust a bandwidth of the active bandpass filter circuit and to adjust the center frequency, the adjustable capacitance device coupled to an input of the operational amplifier and to a second output of the operational amplifier.

20. The computer-readable storage medium of claim 19, wherein the operations further comprise providing a second control signal to the adjustable capacitance device to further adjust the bandwidth, and wherein adjusting the center frequency using the adjustable resistance device does not substantially modify the bandwidth.

* * * * *